United States Patent [19]
Shimizu

[11] Patent Number: 5,665,652
[45] Date of Patent: Sep. 9, 1997

[54] METHOD FOR MANUFACTURING A SEMICONDUCTOR DEVICE WHEREIN ELECTRODES ON A SEMICONDUCTOR CHIP ARE ELECTRICALLY CONNECTED TO LEAD TERMINALS BY PLATING BONDING

[75] Inventor: Shinya Shimizu, Yokohama, Japan

[73] Assignee: Kabushiki Kaisha Toshiba, Kawasaki, Japan

[21] Appl. No.: 592,482

[22] Filed: Jan. 26, 1996

[30] Foreign Application Priority Data

Apr. 12, 1995 [JP] Japan ................................. 7-086876

[51] Int. Cl.$^6$ ................................................. H01L 21/60
[52] U.S. Cl. ........................... 438/127; 438/613; 205/123
[58] Field of Search ................................. 437/209, 203, 437/183, 187; 257/780

[56] References Cited

U.S. PATENT DOCUMENTS

| | | | |
|---|---|---|---|
| 4,672,739 | 6/1987 | Churchwell et al. | 437/209 |
| 4,742,024 | 5/1988 | Sugimoto et al. | 437/209 |
| 4,857,482 | 8/1989 | Saito et al. | 437/209 |
| 5,098,864 | 3/1992 | Mahulikar | 437/209 |
| 5,347,162 | 9/1994 | Pasch | 257/780 |
| 5,410,451 | 4/1995 | Hawthorne et al. | 437/209 |
| 5,416,046 | 5/1995 | Wang | 437/209 |
| 5,459,102 | 10/1995 | Shibata et al. | 437/209 |
| 5,556,810 | 9/1996 | Fujitsu | 437/209 |

FOREIGN PATENT DOCUMENTS

| | | |
|---|---|---|
| 4-37149 | 2/1992 | Japan . |
| 5145000 | 6/1993 | Japan ................................. 257/780 |
| 7-86332 | 3/1995 | Japan . |

OTHER PUBLICATIONS

IBM Technical Disclosure Bulletin, "Ball and Chip Placement Wafer", vol. 30, No. 1, Dec. 1987, pp. 124–125.

*Primary Examiner*—Kevin Picardat
*Attorney, Agent, or Firm*—Finnegan, Henderson, Farabow, Garrett & Dunner, L.L.P.

[57] ABSTRACT

According to a face-down-mounting semiconductor device wherein electrode pads on a semiconductor chip and lead terminals are electrically connected to each other by plating bonding, and a method of manufacturing the semiconductor device, a guide tool is placed on the surface of a semiconductor chip. The guide tool includes guide holes corresponding in position to electrode pads. Columnar lead terminals are inserted into the guide holes of the guide tool. In this state, the semiconductor chip is soaked in a plating solution, together with the guide tool, to execute plating bonding. Since, therefore, the lead terminals can be brought into reliable contact with the electrode pads, metal plating layers can be grown sufficiently between them, thereby improving in reliability of melting bonding.

4 Claims, 3 Drawing Sheets

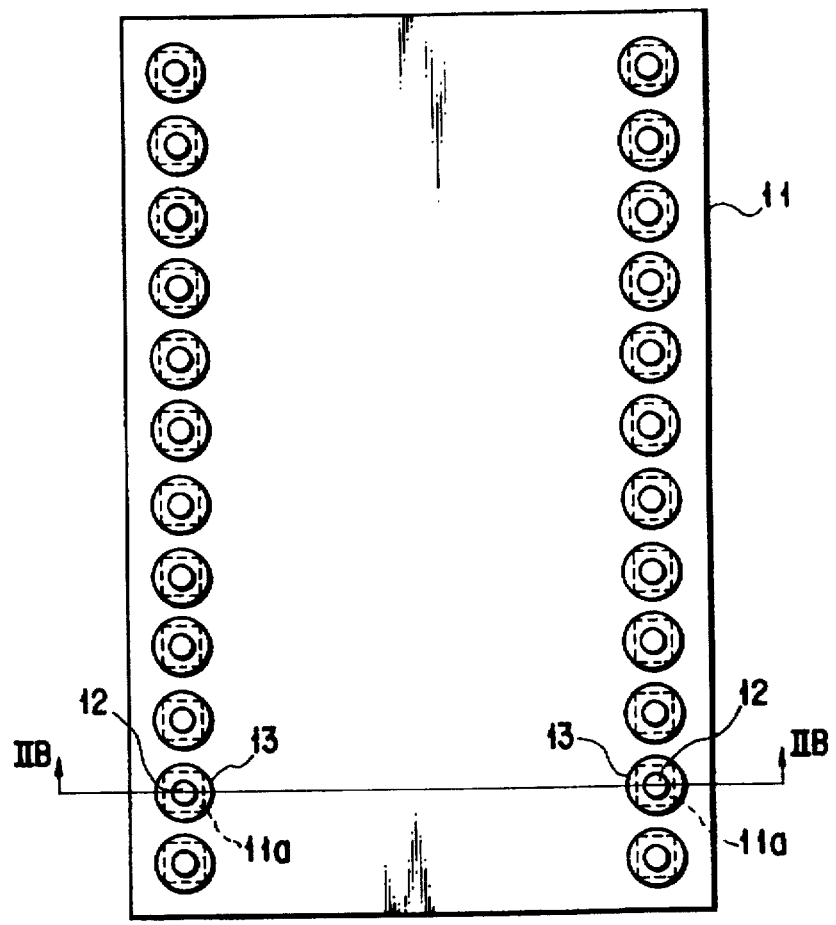
F I G. 2A
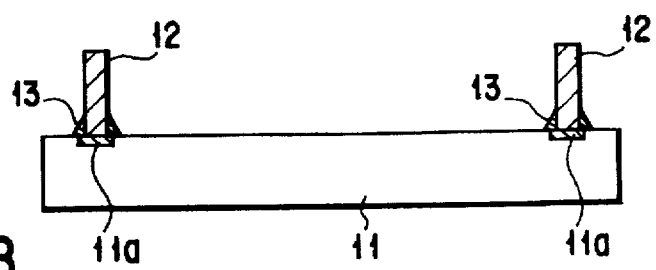
F I G. 2B

5,665,652

METHOD FOR MANUFACTURING A SEMICONDUCTOR DEVICE WHEREIN ELECTRODES ON A SEMICONDUCTOR CHIP ARE ELECTRICALLY CONNECTED TO LEAD TERMINALS BY PLATING BONDING

BACKGROUND OF THE INVENTION

1. Field of the Invention

The present invention relates to a semiconductor device wherein electrode pads on a semiconductor chip are electrically connected to lead terminals by, e.g., plating bonding and a method for manufacturing the same and, more specifically, to a semiconductor device having a face-down-mounting (face-down-bonding) structure and a method for manufacturing the semi-conductor device by the plating bonding.

2. Description of the Related Art

Plating bonding using metal plating has recently been employed experimentally in order to electrically connect electrode pads on the surface of a semiconductor chip and inner leads of lead frames. In this plating bonding, the electrode pads and inner leads are aligned with each other and then soaked in a solution of electrolytic plating thereby to form a metal plating layer at each of connecting portions of the pads and leads.

FIG. 1 is a cross-sectional view schematically showing a semiconductor packaging device as an example of a semiconductor device manufactured by the plating bonding described above. In the semiconductor packaging device, the proximal ends of inner leads 3a of lead frames 3 are bonded onto the surface of a semiconductor chip 1 using an adhesive tape 2. Since a metal plating layer 4 is formed between an electrode pad 1a and a projection 3a' of the distal end of each of the inner leads 3a to electrically connect the pad and inner lead, an LOC (Lead-On-Chip) structure can be achieved. The periphery of the chip 1, including the above connecting portions, i.e., metal plating layers 4, is sealed with resin 5, and outer leads 3b of the lead frames 3 are formed into a predetermined shape. The semiconductor packaging device having such a structure has the advantage that it can be made considerably thinner than a device wherein electrode pads on a semiconductor chip and inner leads of lead frames are connected by wiring.

In the semiconductor packaging device shown in FIG. 1, when the projections 3a' of inner leads 3a and the electrode pads 1a contact each other, i.e., when they are in an initial contact state, the metal plating layers 4 grow sufficiently. In other words, in the initial contact state, plating is obtained from both the inner leads 3a and electrode pads 1a at the same time. Therefore, the metal plating layers 4 formed between the electrode pads 1 and inner leads 3a permit stable, efficient plating bonding.

However, in the prior art semiconductor packaging device described above, it is difficult to bring the projections 3a' of all the inner leads 3a into reliable contact with the electrode pads 1a since the inner leads 3a vary in height. If the inner leads 3a and electrode pads 1a do not contact reliably, the metal plating layers 4 cannot be grown sufficiently and thus the plating bonding is deteriorated in reliability.

SUMMARY OF THE INVENTION

The present invention relates to a semiconductor device capable of improving in reliability of plating bonding and a method for manufacturing the same.

To attain the above object, there is provided a semiconductor device comprising:

a semiconductor chip provided with a plurality of electrodes on a surface thereof;

lead terminals separated from one another and arranged on the plurality of electrodes, respectively; and metal plating layers for electrically connecting the lead terminals and the plurality of electrodes.

There is also provided a method for manufacturing a semiconductor device, comprising the steps of:

arranging insulative members on a semiconductor chip, the insulative members having guide holes corresponding to electrodes formed on the semiconductor chip, and arranging lead terminals on the electrodes through the guide holes, respectively, the lead terminals being separated from one another; and soaking the semiconductor chip in a solution of electrolytic plating together with the insulative members to form metal plating layers for electrically connecting the lead terminals and the electrodes formed on the semiconductor chip.

According to the present invention, since the lead terminals can be placed into reliable contact with the electrodes of the semiconductor chip by gravity and dead load of the terminals, the metal plating layers can always be grown sufficiently.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 2A and 2B are views schematically showing a semiconductor device having a face-down-mounting structure according to an embodiment of the present invention;

DETAILED DESCRIPTION OF THE PREFERRED EMBODIMENTS

Embodiments of the present invention will now be described with reference to the accompanying drawings.

FIGS. 2A and 2B schematically show the constitution of a semiconductor device having a face-down-mounting structure according to an embodiment of the present invention. Of these figures, FIG. 2A is a plan view of the semiconductor device, and FIG. 2B is a cross-sectional view taken along line IIB—IIB of FIG. 2A.

In the semiconductor device shown in FIGS. 2A and 2B, lead terminals 12 are arranged to rise on their respective electrode pads 11a provided on the surface of a semiconductor chip 11. The lead terminals 12 and electrode pads 11a are electrically connected to each other by metal plating layers 13 constituted of nickel (Ni) and the like.

A plurality of electrode pads 11a are arranged at regular intervals on the surface of and along each side of the semiconductor chip 11 in its longitudinal direction. In this embodiment, twelve electrode pads are arranged on each side thereof and thus twenty-four pads are arranged in total.

The lead terminals 12 are columns each having an almost circular section and formed by cutting conductors having the same diameter to a predetermined length. These columns are projections provided separately from one another. To arrange the lead terminals 12 on the electrode pads 11a, for example, a guide tool (insulative member), which will be described later, is employed.

The metal plating layers 13 are formed by soaking the semiconductor chip 11 in a bath of nickel plating, together with the guide tool, while applying a predetermined potential to the lead terminals 12 on the electrode pads 11a. Since, in this case, the lead terminals 12 and electrode pads 11a are placed into reliable contact with each other by gravity and dead load of the terminals 12, the metal plating layers 13 are grown stably and sufficiently.

A method for manufacturing a semiconductor device having the foregoing structure, will now be described.

Figure 1:
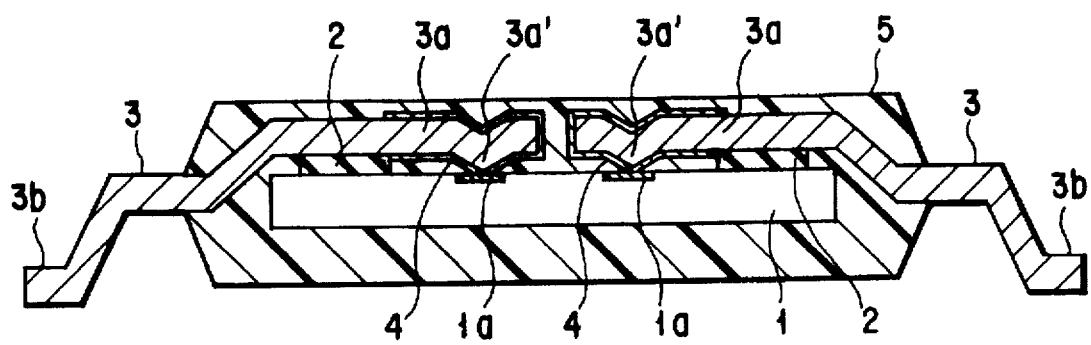
FIG. 1 is a cross-sectional view schematically showing a semiconductor packaging device for explaining prior art and its problems.
Figure 3A:
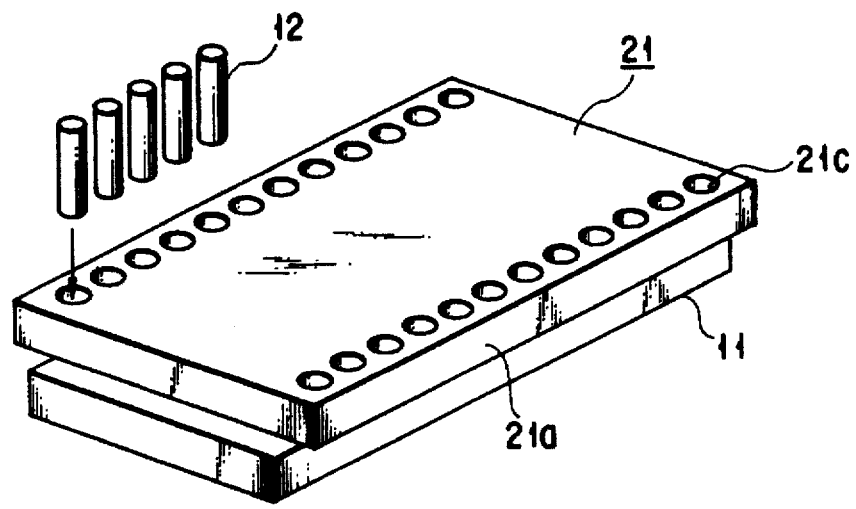
FIGS. 3A to 3C are views for explaining a process of manufacturing the semiconductor device shown in FIGS. 2A and 2B.
Figure 3B:
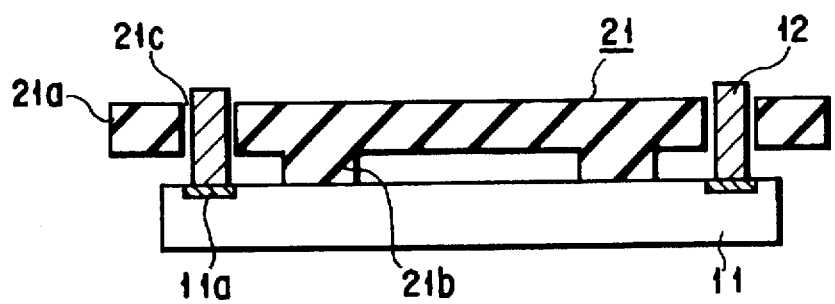
Figure 3C:
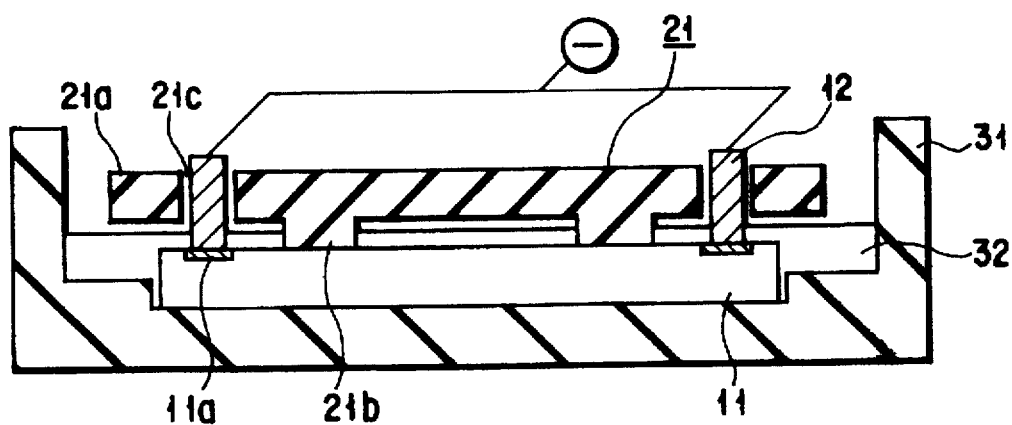

FIGS. 3A to 3C schematically show a process of manufacturing a semiconductor device having the face-down-mounting structure according to the present invention.

Before the manufacturing process is explained, the constitution of the guide tool 12, as shown in FIG. 3A to 3C, will be described in brief. The guide tool 21 is constituted of insulative materials such as Teflon resin which is excellent in processibility and prevents a metal plating layer from growing between the guide tool and semiconductor chip 11 or lead terminals 12. The guide tool 21 includes a top plate 21a which is slightly larger than the semiconductor chip 11 and a rest table 21b for placing the top plate 21a on the surface of the chip 11 with a fixed space therebetween. The top plate 21a is provided with guide holes 21c corresponding in position to the electrode pads 11a. The diameter of each of the guide holes 21c is slightly larger than that of each of the lead terminals 12.

In manufacturing a semiconductor device, the guide tool 21 is aligned with and placed on the surface of the semiconductor chip 11 such that the guide holes 21c coincide with their respective electrode pads 11a on the chip 11. The lead terminals 12 are inserted into the guide holes 21c of the guide tool 21 (FIG. 3A). Thus, the lead terminals 12 are put on the electrode pads 11a of the semiconductor chip 11, and they contact each other (FIG. 3B). After that, the semiconductor chip 11 is soaked in a nickel plating solution 32 in a plating bath 31, together with the guide tool 21, and then a potential is applied to the lead terminals 12 (FIG. 3C). A metal plating layer 13 is formed between each of the lead terminals 12 and its corresponding one of the electrode pads 11a. Since, in this case, the lead terminals 12 and electrode pads 11a contact reliably, plating is obtained from both the lead terminals 12 and electrode pads 11a at the same time. Therefore, the metal plating layers 13 formed from both the electrode pads 11a and lead terminals 12 permit stable, efficient plating bonding.

The formation of a metal plating layer is disclosed in, for example, Jpn. Pat. Appln. KOKAI Publication No. 4-37149 (corresponding to U.S. patent application Ser. No. 707,763) and Jpn. Pat. Appln. KOKAI Publication No. 7-86332, and thus its detailed descriptions are omitted.

After that, the semiconductor chip 11 is taken out of the plating bath 31 to remove the potential from the lead terminals 12, and so is the guide tool 21. Therefore, as shown in FIGS. 2A and 2B, the electrode pads 11a of the semiconductor chip 11 and the lead terminals 12 are connected to each other by the sufficiently-grown metal plating layers 13. The semiconductor device so obtained is mounted on a mounting substrate (not shown) through the lead terminals 12 with the surface of the chip 11 down (face-down-mounting).

As described above, the lead terminals can be brought into reliable contact with the electrode pads on the semiconductor chip by gravity and dead load of the lead terminals. In other words, the lead terminals are arranged on their corresponding electrode pads separately from one another and, in this case, the guide tool is used to guide the lead terminals to the guide holes of the guide tool, with the result that reliable contact between the lead terminals and electrode pads can be automatically achieved. Consequently, the metal plating layers can always be grown sufficiently and the plating bonding can thus be performed with high reliability. Moreover, the semiconductor device of this embodiment can be made considerably smaller than the device using a lead frame since it requires no leads to extend.

The present invention is not limited to the above embodiment. For example, as shown in FIGS. 4 and 5, it can be applied to a semiconductor device packaged with sealing resin or the like, that is, a so-called semiconductor packaging device.

Figure 4:
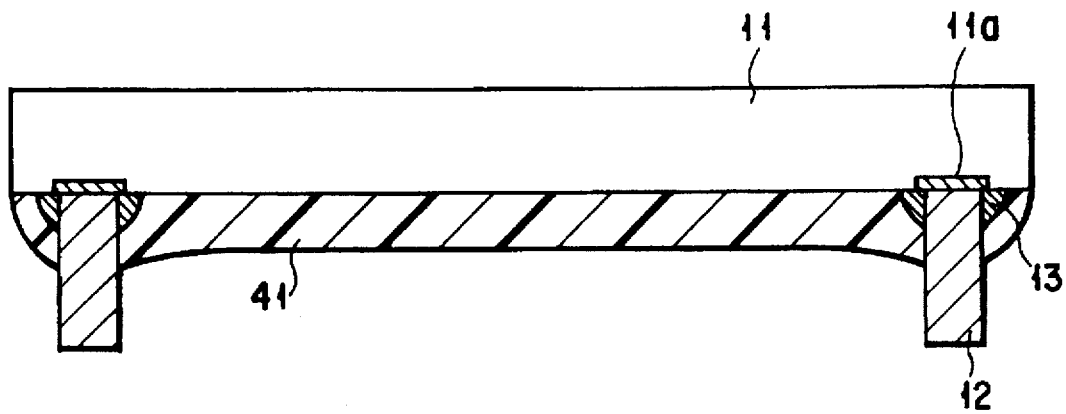
FIG. 4 is a cross-sectional view schematically showing a semiconductor packaging device obtained by packaging the semiconductor device shown in FIGS. 2A and 2B.

FIG. 4 is a cross-sectional view schematically showing the constitution of a semiconductor packaging device manufactured by packaging at least the surface of a semiconductor chip with potting resin. In FIG. 4, the device is put on its surface in view of mounting on a mounting substrate (not shown).

In the semiconductor packaging device shown in FIG. 4, the columnar lead terminals 12 are arranged to rise on the electrode pads 11a on the surface of the semiconductor chip 11. The lead terminals 12 and electrode pads 11a are electrically connected to each other by the metal plating layers 13 of nickel (Ni) and the like. At least the surface of the chip 11, including the metal plating layers 13, is sealed with potting resin 41.

Figure 5:
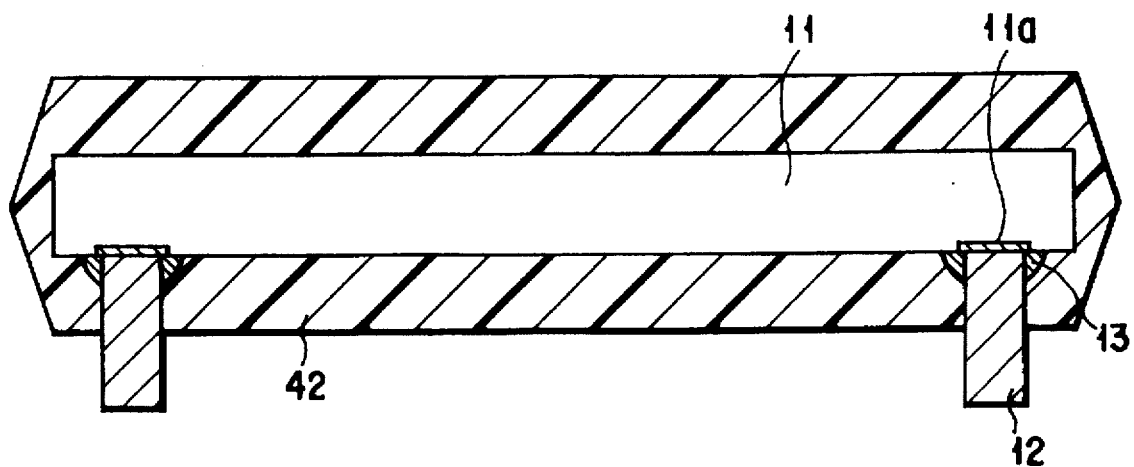
FIG. 5 is a cross-sectional view schematically showing another semiconductor device obtained by packaging the semiconductor device shown in FIGS. 2A and 2B.

FIG. 5 is a cross-sectional view schematically showing the constitution of a semiconductor packaging device manufactured by packaging the semiconductor chip 11 by mold resin or the like. In FIG. 5, too, the device is put on its surface in view of mounting on a mounting substrate (not shown).

In the semiconductor packaging device shown in FIG. 5, the columnar lead terminals 12 are arranged to rise on the electrode pads 11a on the surface of the semiconductor chip 11. The lead terminals 12 and electrode pads 11a are electrically connected to each other by the metal plating layers 13 of nickel (Ni) and the like. The periphery of the chip 11, including the metal plating layers 13, is sealed with mold resin 42.

The semiconductor packaging device shown in FIGS. 4 and 5 has the same advantage as that of semiconductor device having the face-down-mounting structure according to the above embodiment, and has the great advantage of moisture resistance and easy handling.

In either constitution of the above semiconductor packaging device, the section of each of lead terminals 12 is not limited to an almost circular one, but various shapes such as a triangle and a rectangle can be adopted. The height (length) thereof is not limited, either.

Furthermore, the lead terminals 12 can be formed as a sphere as well as a column.

Figure 6:
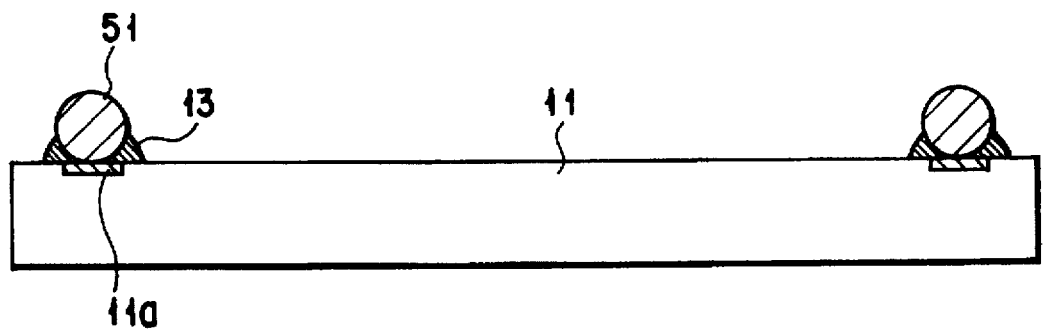
FIG. 6 is a cross-sectional view schematically showing a semiconductor device according to another embodiment of the present invention.

FIG. 6 is a cross-sectional view schematically showing a face-down-mounting semiconductor device according to another embodiment of the present invention.

In the semiconductor device shown in FIG. 6, spherical lead terminals 51 are arranged to rise on their respective electrode pads 11a formed on the surface of a semiconductor chip 11. The lead terminals 51 and electrode pads 11a are electrically connected to each other by a metal plating layer 13 constituted of nickel (Ni) and the like. In this semiconductor device, too, the same advantage can be expected as that of the device using the columnar lead terminals. Moreover, the device can easily be packaged by sealing resin or the like.

It is needless to say that various changes and modifications can be made without departing from the scope of the subject matter of the present invention.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method for manufacturing a semiconductor device, comprising the steps of:

positioning insulative members on a surface of a semiconductor chip on which electrodes are formed, said insulative members having guide holes corresponding to the electrodes, and guiding lead terminals into the guide holes, respectively, said lead terminals being separated from one another; and soaking the semiconductor chip in a solution of electrolytic plating together with the insulative members while the electrodes and the lead terminals contact each other to form metal plating layers for electrically connecting the lead terminals and the electrodes.

2. The method according to claim 1, wherein each of said lead terminals is a projection comprising a conductive material.

3. The method according to claim 1, wherein each of said lead terminals is a sphere comprising a conductive material.

4. The method according to claim 1, further comprising a step of forming a sealing member on at least a surface of said semiconductor chip including the metal plating layers.

* * * * *